(12) United States Patent
Rutten et al.

(10) Patent No.: US 11,502,699 B1
(45) Date of Patent: Nov. 15, 2022

(54) SYSTEM AND METHOD OF CALIBRATION OF SIGMA-DELTA CONVERTER USING INJECTED SIGNAL CORRELATION

(71) Applicant: NXP B.V., Eindhoven (NL)

(72) Inventors: Robert Rutten, Nistelrode (NL); Hendrik van der Ploeg, Waalre (NL); Lucien Johannes Breems, Waalre (NL); Martin Kessel, Bannewitz (DE); Muhammed Bolatkale, Delft (NL); Bernard Burdiek, Halstenbek (DE); Manfred Zupke, Hamburg (DE); Johannes Hubertus Antonius Brekelmans, Nederweert (NL); Shagun Bajoria, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/357,467

(22) Filed: Jun. 24, 2021

(51) Int. Cl.
    *H03M 3/00* (2006.01)

(52) U.S. Cl.
    CPC .............. *H03M 3/38* (2013.01); *H03M 3/438* (2013.01)

(58) Field of Classification Search
    CPC .................................. H03M 3/38; H03M 3/438
    See application file for complete search history.

(56) References Cited

U.S. PATENT DOCUMENTS

| | | | | |
|---|---|---|---|---|
| 6,445,318 B1* | 9/2002 | Ruha | ................... | H03M 3/3287 341/131 |
| 6,873,281 B1* | 3/2005 | Esterberg | ............. | H03M 3/344 341/76 |
| 7,193,546 B1* | 3/2007 | Melanson | ................ | H03M 3/38 341/120 |
| 7,221,302 B1* | 5/2007 | Melanson | ............. | H03M 3/386 341/131 |
| 7,317,411 B1* | 1/2008 | Nanda | ................. | H03M 3/3287 341/131 |
| 7,321,325 B2 | 1/2008 | Hsieh et al. | | |
| 7,324,028 B2 | 1/2008 | Hsieh et al. | | |

(Continued)

OTHER PUBLICATIONS

Cao, Zhiheng et al. "A Digital Background Calibration Method for Mash Σ- Δ Modulators by Using Coefficient Estimation." IEEE 2005 pp. 3091-3094.

(Continued)

*Primary Examiner* — Lam T Mai

(57) ABSTRACT

A digital conversion system including a sigma-delta converter, a signal generator providing a substantially symmetrical injection signal that is injected into the sigma-delta converter conversion path, bandpass filters for filtering the injection signal and the output of the sigma-delta converter, a correlator that correlates the filtered signals for providing an error signal, and a loop controller that uses the error signal to adjust a resonant frequency of the sigma-delta converter to output a target notch frequency. The loop controller may adjust a resonant frequency of a loop filter of the sigma-delta converter, in which the bandpass filters may each be centered at the target notch frequency at the output of the sigma-delta converter. The correlator may include a complex conjugate block, a multiplier and a mean calculator. The loop controller may include a converter and an amplifier and an integrator or a least-mean square block.

20 Claims, 8 Drawing Sheets

(56) References Cited

U.S. PATENT DOCUMENTS

| | | | | |
|---|---|---|---|---|
| 7,911,241 | B1* | 3/2011 | Zeller | H03L 7/1976 327/159 |
| 9,698,809 | B1* | 7/2017 | Mallett | H03M 1/1071 |
| 9,985,646 | B1* | 5/2018 | Mallett | H03M 3/494 |
| 10,804,913 | B1* | 10/2020 | Talegaonkar | H03L 7/099 |
| 10,862,505 | B1* | 12/2020 | Rey | H03H 17/0642 |
| 11,239,923 | B2* | 2/2022 | Wang | H04B 17/101 |
| 2007/0046517 | A1* | 3/2007 | Behboodian | H03M 7/3008 341/143 |
| 2008/0159438 | A1* | 7/2008 | Kulinets | H03C 3/0933 332/100 |
| 2011/0037631 | A1* | 2/2011 | Lai | H03M 1/1004 341/120 |
| 2012/0212296 | A1* | 8/2012 | Chen | H03C 3/0925 331/25 |
| 2013/0194114 | A1* | 8/2013 | Ritter | H03M 3/368 341/110 |
| 2017/0170839 | A1* | 6/2017 | Zhao | H03M 1/1071 |
| 2017/0170840 | A1* | 6/2017 | Zhao | H03M 3/464 |
| 2017/0250662 | A1* | 8/2017 | Cope | H03F 1/523 |
| 2019/0013797 | A1* | 1/2019 | Thuries | H04L 27/0008 |
| 2019/0305794 | A1* | 10/2019 | Cao | H03M 3/344 |

OTHER PUBLICATIONS

Silva-Rivas, F. et al. "Digital Based Calibration Techniques for Continuous-time Bandpass Sigma-Delta Analog-to-Digital Converters." Analog Integr Circ Sig Process. 2009. pp. 91-95.

Duggal, Ashwin et al. "Calibration of Delta-Sigma Data Converters in Synchronous Demodulation Sensing Applications." IEEE Sensors Journal. Feb. 2011. pp. 1524-1527.

Breems, Lucien et al. "A 2.2. GHz Continuous-Time $\Delta\Sigma$ ADC With -102 dBc THD and 25 MHz BAndwidth." IEEE Journal of Solid-State Circuits. vol. 51, No. 12. Dec. 2016. pp. 2906-2916.

Schuchman, Leonard. "Dither Signals and Their Effect on Quantization Noise." IEE Transactions of Communication Technology. Dec. 1964. pp. 162-165.

Lu, Cho-Ying et al. "A Sixth-Order 200 MHz IF Bandpass Sigma-Delta Modulator With Over 68 dB SNDR in 10 MHz Bandwidth." *IEEE Journal of Solid-State Circuits*. vol. 45, No. 6. Jun. 2010. pp. 1122-1136.

* cited by examiner

SYSTEM AND METHOD OF CALIBRATION OF SIGMA-DELTA CONVERTER USING INJECTED SIGNAL CORRELATION

BACKGROUND

Field of the Invention

The present invention relates in general to calibrating a sigma-delta converter, and more particularly to a system and method of calibrating a sigma-delta converter using injected signal correlation.

Description of the Related Art

In higher order sigma-delta converters including sigma-delta analog to digital converters (ADCs) and the like, resonators are typically used to get a better signal to quantization noise ratio (SQNR) in the band of interest (BoI). The resonator frequencies are determined by the loop filter in the ADC design. Typically, the resonator frequencies are set by passive devices such as a combination of resistors and capacitors. The resonator frequencies determine the level of the quantization noise in the BoI. The elements setting these resonator frequencies suffer, however, from manufacturing variation and temperature dependency. If the quantization noise is a significant contributor to the total noise performance, the resonator frequencies need to be calibrated and require tracking over temperature variation.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A system and method of calibration of a sigma-delta converter as described herein uses correlation between an output of the converter and an injected signal to find an optimal resonator frequency in the ADC. Pseudo Random Bit Stream (PRBS) signal injection is a known way to improve the performance of a sigma-delta converter in which a PRBS dither signal is typically injected at the input of a quantizer of the converter. Thus, the PRBS signal, if used, provides a conveniently available injected signal for use in calibration. If PRBS is not used or otherwise not provided, a separate signal may be generated and injected into the converter. The injected signal has frequency-symmetrical power around a target notch frequency within a selected frequency passband centered at the target notch frequency. The symmetry need not be perfect so long as substantially symmetrical for calibration to be sufficiently successful. In one embodiment, the injected signal may be randomized, such as a pseudo-random signal. In another embodiment, the injected signal may be a dual tone signal positioned on either side of the target notch frequency. The injected signal and output signal are both filtered with a corresponding one of a pair of bandpass filters. In one embodiment, each bandpass filter has a passband with a center frequency at the target notch frequency of the output signal of the converter.

It is noted that the resonator frequency of a loop filter of the sigma-delta converter results in a corresponding notch frequency at the output of the sigma-delta converter. The injected signal is substantially symmetrical around a target notch frequency within a selected frequency passband centered at the target notch frequency (e.g., pseudo-random signal, dual tone signal, etc.). Theoretically, there is a 180 degrees phase shift of the injected signal modulated in the converter output, so that the correlation between the two bandpass filtered signals is zero or substantially near zero when the notch frequency is at the target location. Calibration circuitry monitors the correlation result and adapts the resonant frequency of the loop filter to adjust the ADC notch frequency accordingly in a calibration loop.

The calibration of the present system and method converges relatively quickly when the sigma-delta converter is off-line and not processing an input signal. The calibration of the present system and method may be used for background calibration when an input signal is applied, although convergence becomes slower. The present system and method is thus particularly advantageous for start-up or periodic off-line calibration, and is also useful for background calibration in the presence of an input signal when slower calibration may be tolerated.

Figure 1:
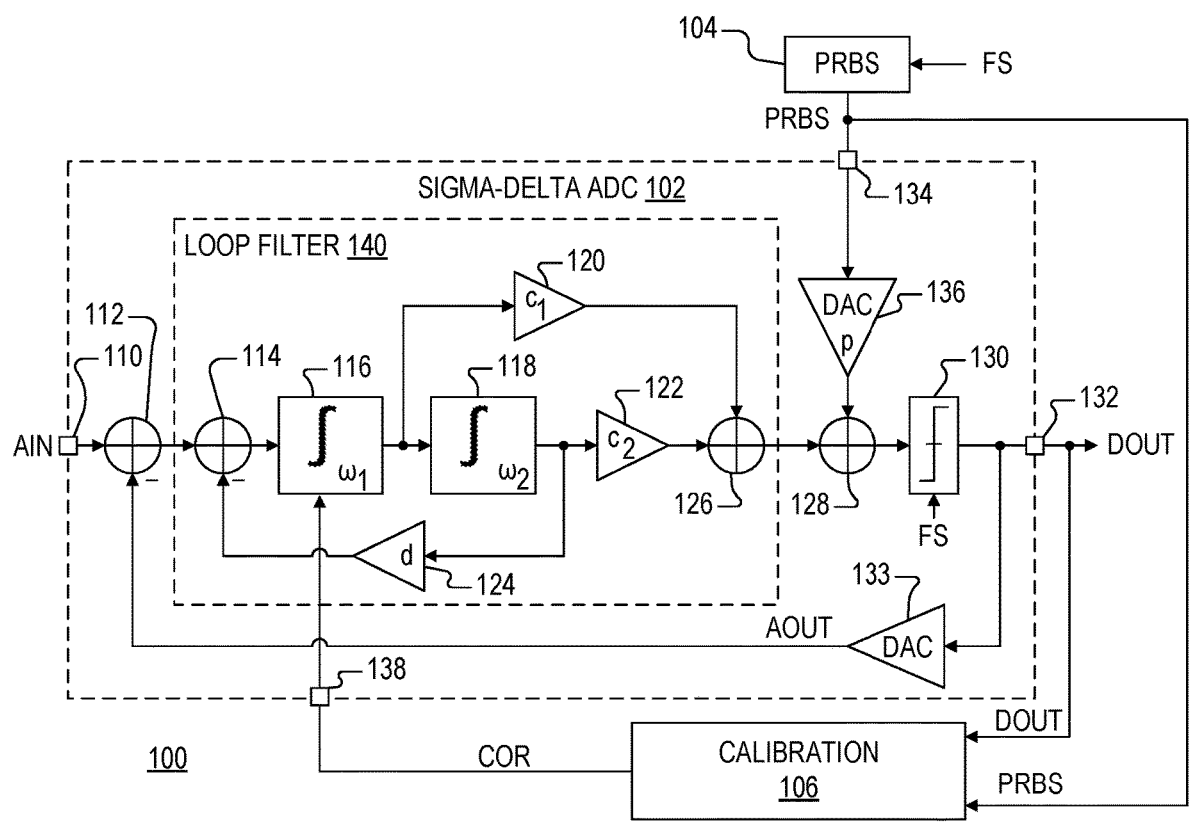
FIG. 1 is a simplified block diagram of a digital conversion system including calibration circuitry implemented according to an embodiment of the present disclosure.

FIG. 1 is a simplified block diagram of a digital conversion system 100 including calibration circuitry 106 implemented according to an embodiment of the present disclosure. In the illustrated embodiment, the digital conversion system 100 includes a sigma-delta analog to digital converter (ADC) 102 receiving a PRBS dither signal from a PRBS generator 104, and also includes the calibration circuitry 106 for calibrating the sigma-delta ADC 102. In the illustrated embodiment, the sigma-delta ADC 102 includes a loop filter 140 that determines at least one resonator frequency used to get a better signal to quantization noise ratio (SQNR) in the band of interest (BoI) of the sigma-delta ADC 102. In general, the resonator frequencies of a converter determine the level of the quantization noise in the BoI. The elements setting these resonator frequencies suffer, however, from manufacturing variation and temperature dependency. Such elements may include any combination of passive elements (e.g., resistors, capacitors, inductors) and active elements (e.g., transistors and the like). If the quantization noise is a significant contributor to the total noise performance, each resonator frequency should be calibrated and tracked over temperature.

An analog input signal AIN is provided to an analog input 110 of the sigma-delta ADC 102, in which AIN is provided to a positive input of an adder 112. It is noted that although the conversion system is illustrated by an ADC, the input signal AIN may alternatively be a digital signal. The output of the adder 112 is provided to a positive input of another adder 114, having its output coupled to an input of an integrator 116 with radian frequency $\omega_1$. The output of the integrator 116 is coupled to an input of another integrator 118 with radian frequency $\omega_2$ and to an input of an amplifier 120 with a gain of $c_1$. It is noted that $\omega_1$ and $\omega_2$ may be referred to as the gains of the integrators 116 and 118, respectively. The output of the integrator 118 is coupled to an input of an amplifier 122 with a gain of $c_2$ and to an input of another amplifier 124 with a gain of d. The output of the amplifier 124 is provided to a negative input of the adder 114. The outputs of the amplifiers 120 and 122 are provided to respective positive inputs of an adder 126, having its output coupled to a positive input of another adder 128. The output of the adder 128 is coupled to the input of a quantizer 130, having its output providing a digital output signal DOUT provided via an ADC output 132.

In one embodiment, DOUT is a single-bit output, such as a series of 1's and 0's or the like. In another embodiment, DOUT may be a multibit value. DOUT is fed back to an input of a digital to analog converter (DAC) 133 having an output providing an analog output signal AOUT (an analog version of DOUT) provided to a negative input of the adder 112. The adders 112 and 114 may alternatively be referred to as subtractors in which adder 112 develops its output by subtracting AOUT from AIN and the adder 114 develops its output by subtracting the output of the amplifier 124 from the output of the adder 112. The adders 120 and 126 add their respective inputs to develop their outputs in the illustrated configuration.

In alternative embodiments, AIN may be a digital signal in which the DAC 133 may be omitted or replaced by a digital-to-digital converter or amplifier. The sigma-delta ADC 102 is an example of a sigma-delta system implemented according to a $2^{nd}$ order feedforward architecture. The present system and method of calibration as described herein may be applied to other structures or architectures, such as feedback architectures, combined feedback/feedforward architectures, and higher order configurations (e.g., $3^{rd}$ order, $4^{th}$ order, etc.) and the like.

The PRBS signal from the PRBS generator 104 is provided to an injection input 134 of the sigma-delta ADC 102, in which the PRBS signal is provided to an input of a digital to analog converter (DAC) 136 having a gain of p. The output of the DAC 136 is provided to another positive input of the adder 128, which provides the sum of the outputs of the adder 126 and the DAC 128 to the input of the quantizer 130. The DOUT and PRBS signals are provided to respective inputs of the calibration circuitry 106, having its output providing a correction signal COR to a frequency adjust input 138 of the sigma-delta ADC 102. The adders 114 and 126, the integrators 116 and 118, and the amplifiers 120, 122, and 124 collectively form the loop filter 140 within the sigma-delta ADC 102. The sigma-delta ADC 102 includes the adders 112 and 128, the DACs 133 and 136, the quantizer 130, and the loop filter 140. The PRBS generator 104 and the quantizer 130 both receive a sample signal FS. The COR signal from the calibration circuitry 106 is used to adjust a resonant frequency of the loop filter 140 of the sigma-delta ADC 102 as further described herein. In one embodiment, the COR signal is provided to adjust the gain $\omega_1$ of the integrator 116. In alternative embodiments, COR may be used to adjust other values or parameters, such as $c_1$, $c_2$, d, $\omega_2$, or the like or a combination of such parameters.

In a more particular embodiment, $\omega_1$=2.5 Megahertz (MHz), $\omega_2$=400 kilohertz (kHz), FS has an oversampling frequency of 100 MHz, $c_1$=0.2, $c_2$=0.25, d=0.05, and p=0.05. These are approximate values for a particular configuration and alternative values are contemplated for different implementations. In addition, one or more of these parameters are adjusted during calibration to adjust a resonant frequency of the loop filter 140 and hence a notch frequency at the output of the sigma-delta ADC 102. In one embodiment, DOUT is a digital signal having a binary "1" or "0" for a single-bit quantizer 130, and the DAC 133 converts DOUT to AOUT by converting digital input "1" to +1 and digital input "0" to −1.

Figure 13:
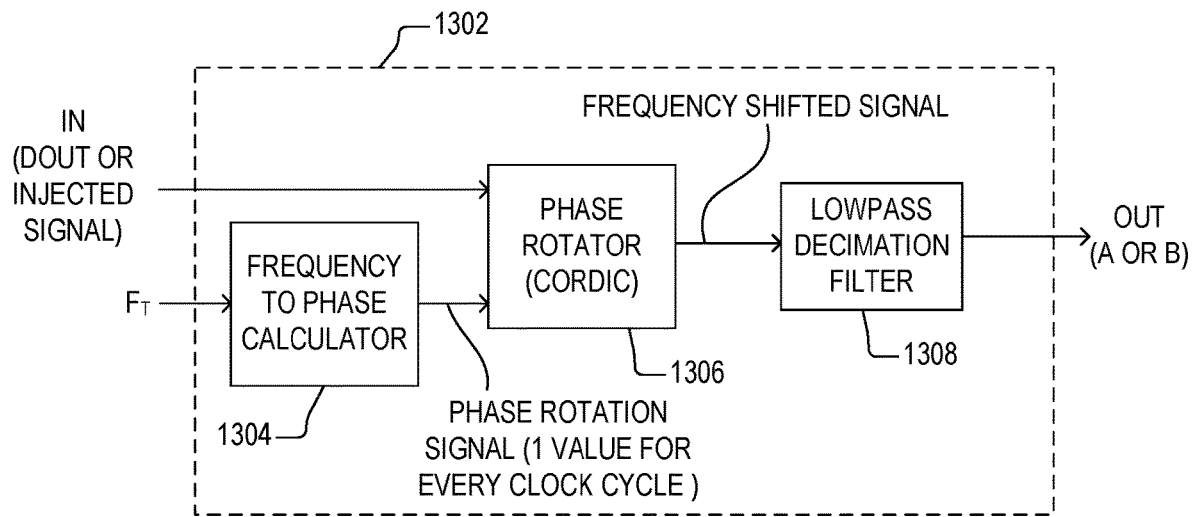
FIG. 13 is a simplified block diagram of an alternative bandpass filter that may be used instead of each of the bandpass filters of FIG. 4 according to one embodiment of the present disclosure.

As previously noted, PRBS is a pseudo-random signal that is conveniently available since used as a dither input signal injected at the input of the quantizer 130 to improve performance of the digital conversion system 100. In an alternative configuration, such as when the PRBS is not provided or otherwise not available, then a separate pseudo-random generator (not shown) may be included to generate a pseudo-random signal or at least a signal that is pseudo-random in the passband frequency range of the bandpass filters 402 and 404 (FIG. 4) described further herein. In any of the embodiments, the injected signal is substantially symmetrical with respect to a target notch frequency (see, e.g., FN of FIG. 3) within the passband of the bandpass filters 402 and 404 or of the bandpass filter 1302 (FIG. 13). In another embodiment, for example, the injected signal may be dual tone signal located on either side of the target notch frequency. The dual tone signal may be injected in a similar manner as shown in FIG. 1 using the adder 128 or other signal combiner. The generated signal is injected into the conversion path of the sigma-delta ADC 102 to achieve correlation for purposes of calibration.

Figure 2:
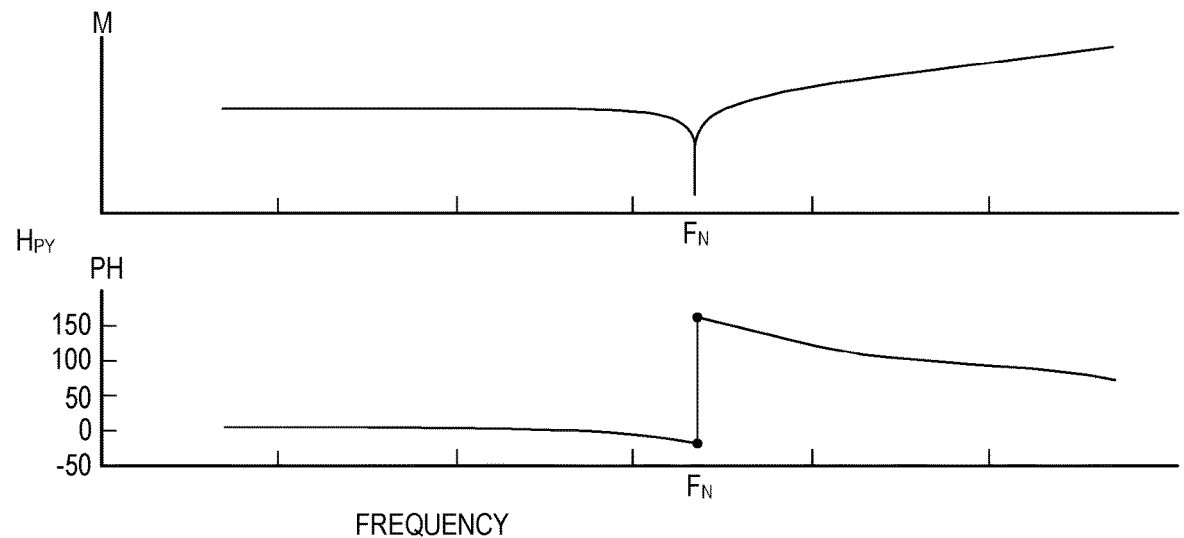
FIG. 2 shows a pair of graphic diagrams plotting the magnitude (M) and phase (PH) versus frequency of a transfer function $H_{PY}$ from the PRBS signal to the output DOUT of the sigma-delta ADC of FIG. 1 according to one embodiment of the present disclosure.

FIG. 2 shows a pair of graphic diagrams plotting the magnitude (M) and phase (PH) versus frequency of a transfer function $H_{PY}$ from the PRBS signal to the output DOUT of the sigma-delta ADC 102 according to one embodiment of the present disclosure. The particular units of the magnitude and frequency are not shown, but magnitude is typically measured in decibels (dB) and frequency is typically measured in Hertz (Hz). The units of phase are shown in degrees. The resonant frequency of the loop filter 140 creates a notch (or zero in the zero/pole diagram) at a notch frequency $F_N$. The phase of $H_{PY}$ undergoes an instant 180° phase shift at the notch frequency $F_N$. The transfer function $H_{LF}$ of the loop filter 140 of the sigma-delta ADC 102 is according to the following equation (1):

$$H_{LF} = \frac{c_1\omega_1 s + c_2\omega_1\omega_2}{s^2 + \omega_1\omega_2 d} \quad (1)$$

which represents one zero and one complex conjugate pole combination. The transfer function $H_{PY}$ from the PRBS signal to the output DOUT is according to the following equation (2):

$$H_{PY} = \frac{1}{1 + DAC_{gain} * H_{LF}} \quad (2)$$

where $DAC_{gain}$ is the gain of the DAC 133, which is 1 in the illustrated embodiment. $H_{PY}$ may also be referred to as the Noise Transfer Function (NTF) of the sigma-delta ADC 102.

Figure 3:
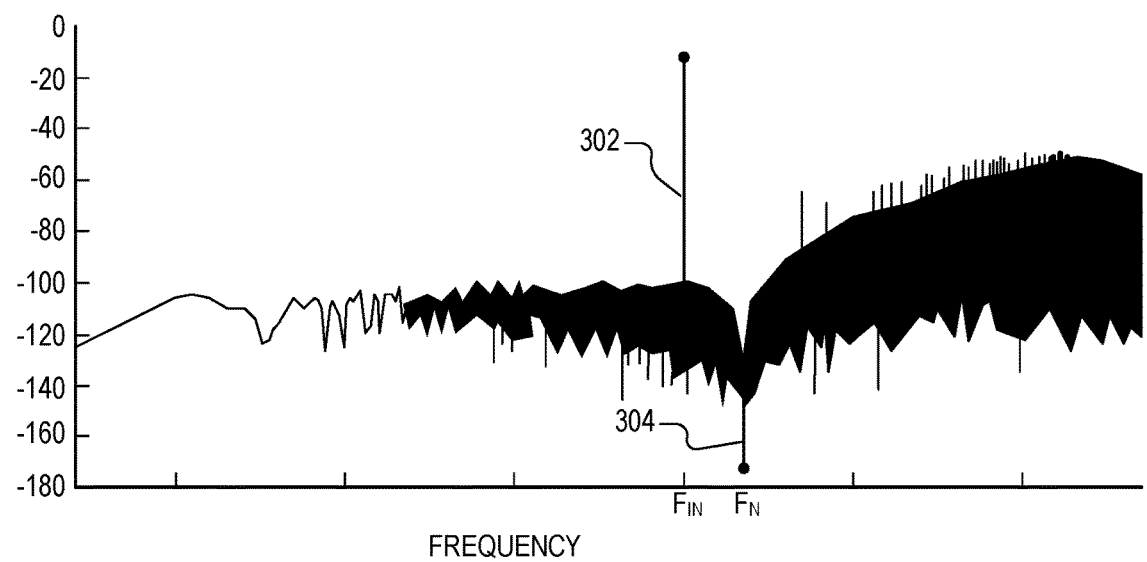
FIG. 3 is a graphic diagram plotting the output spectrum of DOUT (shown as signal power measured in dB) versus frequency for the sigma-delta ADC of FIG. 1 using an input signal AIN at an input frequency FIN according to one embodiment of the present disclosure.

FIG. 3 is a graphic diagram plotting the output spectrum of DOUT (shown roughly as signal power measured in dB) versus frequency for the sigma-delta ADC 102 using an input signal AIN at an input frequency $F_{IN}$ according to one embodiment of the present disclosure. A positive spike 302 occurs coincident with the input signal AIN at FIN, and a notch 304 occurs at about the notch frequency FN. In a non-limiting specific embodiment using the specific radian and gain units previously described along with AIN provided as a 100 kHz sine wave (e.g., $F_{IN}$=100 kHz), the notch 304 occurs at a notch frequency FN of about 223.5 kHz.

Figure 4:
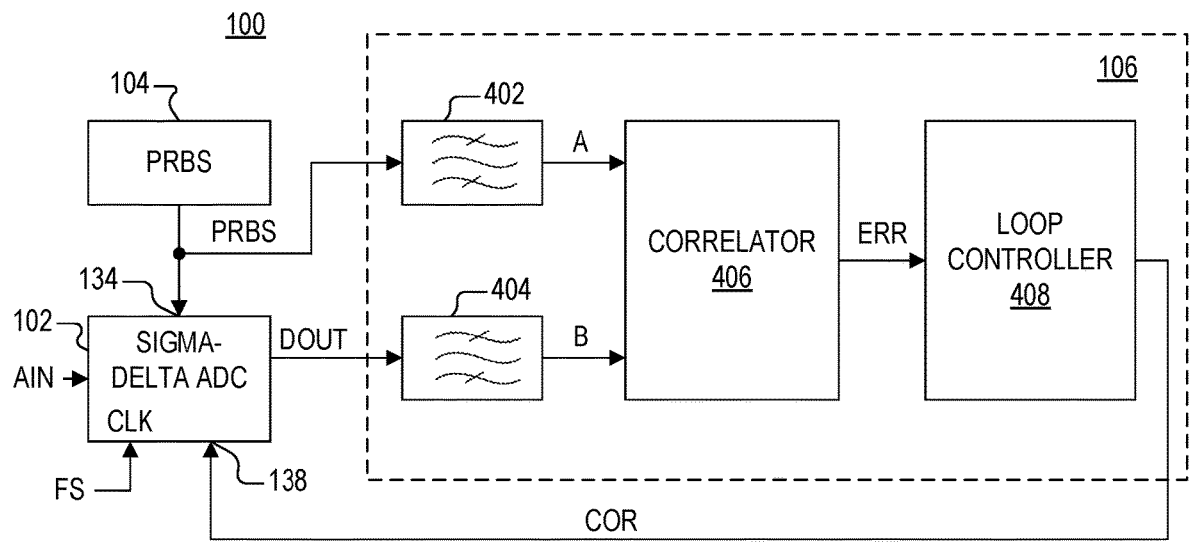
FIG. 4 is a simplified block diagram of the digital conversion system of FIG. 1 including further details of the calibration circuitry implemented according to an embodiment of the present disclosure.

FIG. 4 is a simplified block diagram of the digital conversion system 100 including further details of the calibration circuitry 106 implemented according to an embodiment of the present disclosure. The calibration circuitry 106 includes a first bandpass filter 402, a second bandpass filter 404, a correlator 406, and a loop controller 408. The PRBS signal from the PRBS generator 104 is provided to an input of the first bandpass filter 402 and the DOUT output of the sigma-delta ADC 102 is provided to an input of the second bandpass filter 404 of the calibration circuitry 106. The outputs of the bandpass filters 402 and 404, shown as signals A and B, respectively, are provided to a respective pair of inputs of the correlator 406, having an output providing an error (ERR) signal to an input of the loop controller 408. The loop controller 408 uses the ERR signal to develop the correction signal COR, which is fed back to the frequency adjust input 138 of the sigma-delta ADC 102. The sigma-delta ADC 102 has a clock input CLK receiving the sample signal FS.

The bandpass filters 402 and 404 are substantially identical and both are implemented with a frequency passband that is centered at the target notch frequency at the output of the sigma-delta ADC 102. The target notch frequency is predetermined based on operating parameters of the sigma-delta ADC 102. In one embodiment, the bandpass filters 402 and 404 are each configured as a complex filter which passes only a part of the positive frequency band. As an example, a complex filter may contain 2 real filters, one for the in-phase (I) path and one for the quadrature (Q) path. A complex I/Q filter can generate a filter response which is asymmetrical around 0 Hz, and can bandpass frequencies in the positive frequency domain while attenuating frequencies in the negative frequency domain. It has been determined that when the resonant frequency of the loop filter 140 is tuned so that the notch at the output of the sigma-delta ADC 102 is at the target notch frequency, the correlation between the PRBS and DOUT signals cancel out or otherwise reach a minimum correlation value, such as zero. If the resonant frequency of the loop filter 140 varies because of manufacturing variations, operating conditions, aging, temperature changes, voltage variations, along with other possible changes and variations, then the resonant frequency is off target so that the actual notch frequency is not aligned with the center frequency of the bandpass filters 402 and 404. As a result, the correlation results are nonzero as reflected by the ERR signal. The loop controller 408 uses negative feedback to provide COR to adjust the resonant frequency of the loop filter 140 and thus the notch frequency at the output of the sigma-delta ADC 102 to minimize the magnitude of ERR. In this manner, the sigma-delta ADC 102 is calibrated.

Figure 5:
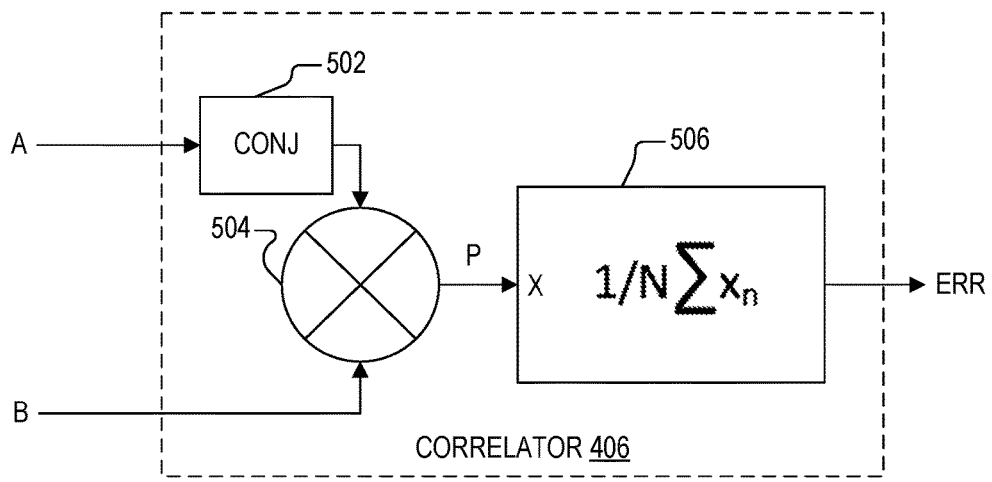
FIG. 5 is a simplified block diagram of the correlator of FIG. 4 implemented according to one embodiment of the present disclosure.

FIG. 5 is a simplified block diagram of the correlator 406 implemented according to one embodiment of the present disclosure. The correlator 406 includes a complex conjugate block 502, a multiplier 504, and mean calculator 506. The output signal A of the first bandpass filter 402 is provided to an input of the complex conjugate block 502, having an output provided to one input of the multiplier 504. The output signa B of the second bandpass filter 404 is provided to the other input of the multiplier 504, having an output providing a product value P to an input of the mean calculator 506. The mean calculator 506 calculates the mean of the multiplied result to develop the ERR signal. In one embodiment, the mean calculator 506 is a summing and divider block that generates a running average of that last integer number of "N" multiplier output samples, such as accumulating the last N samples into a running sum and dividing the sum by N. The complex conjugate block 502 may be applied to either one of the A and B inputs; essentially, one of the filtered signals is flipped in the frequency domain, so that the product should be zero when the filtered signals are equal or substantially equal.

The correlator 406 is configured according to only one possible correlation type, in which alternative types of correlators or correlation calculators may be used. In addition, alternative types of summing or integration functions may be used.

Figure 6:
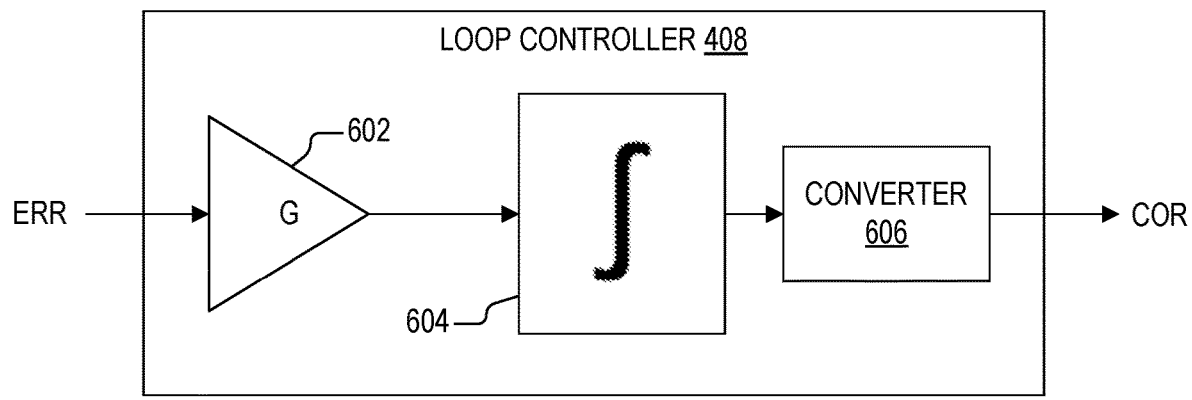
FIG. 6 is a simplified block diagram of the loop controller of FIG. 4 implemented according to one embodiment of the present disclosure.

FIG. 6 is a simplified block diagram of the loop controller 408 implemented according to one embodiment of the present disclosure. The loop controller 408 includes an amplifier 602, an integrator 604, and a converter 606. The ERR signal is provided to an input of the amplifier 602, having an output coupled to an input of the integrator 604, having an output coupled to an input of the converter 606, having an output providing the COR signal. The amplifier 602 has a scalar gain G that may be used to adjust the gain of the control loop used for adjusting the resonant frequency of the loop filter 140. The integrator 604 integrates the output of the amplifier 602 for loop control. The converter 606 converts the output of the integrator 604 so that the COR signal has a scale and range suitable for the parameter being adjusted within the sigma-delta ADC 102 to adjust the notch frequency accordingly. In this manner, the COR signal adjusts a parameter within the sigma-delta ADC 102 to adjust the resonant frequency of the loop filter 140, which in turn adjusts the notch frequency to minimize the ERR signal.

The convergence time is dependent on the gain of the control loop as may be controlled by the gain of the amplifier 602. The gain should be chosen such that the loop is sufficiently fast while also being sufficiently stable after settling. The gain value may depend on many parameters including, for example, ADC sampling rate, dither amplitude, potential blocker signals, etc. The control loop works such that after convergence the notch frequency is positioned at a center frequency $F_C$ of the bandpass filters 402 and 404 when the spectrum around the target frequency notch is symmetrical.

Figure 7:
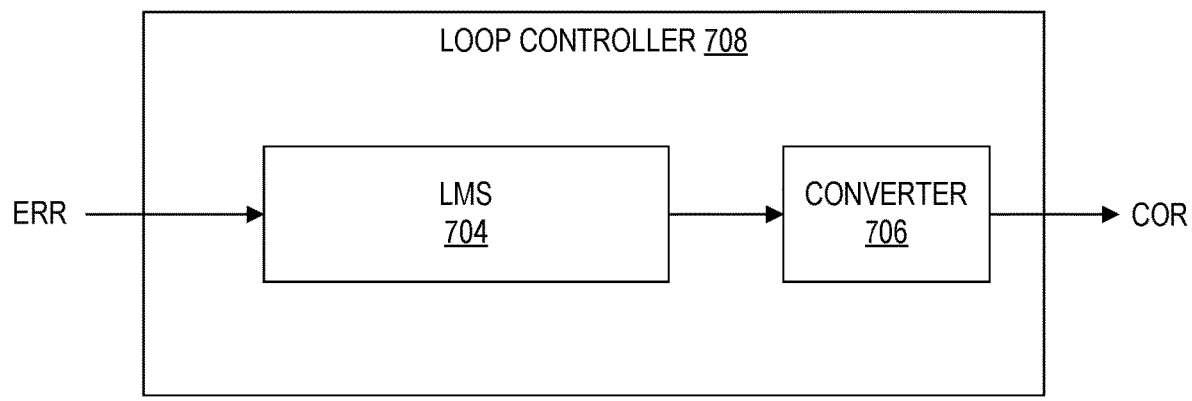
FIG. 7 is a simplified block diagram of the loop controller of FIG. 4 implemented according to another embodiment of the present disclosure.

FIG. 7 is a simplified block diagram of a loop controller 708 implemented according to another embodiment of the present disclosure which may be used as the loop controller 408. The loop controller 708 is substantially similar to the loop controller 408 in which the gain block 602 and the integrator 604 are replaced by an alternative function such as a least-mean square (LMS) block 704 for controlling gain and loop operation. The converter 606 is replaced by a similar converter 706 that performs substantially the same function to convert the output of the LMS block 704 into the COR signal.

Figure 8:
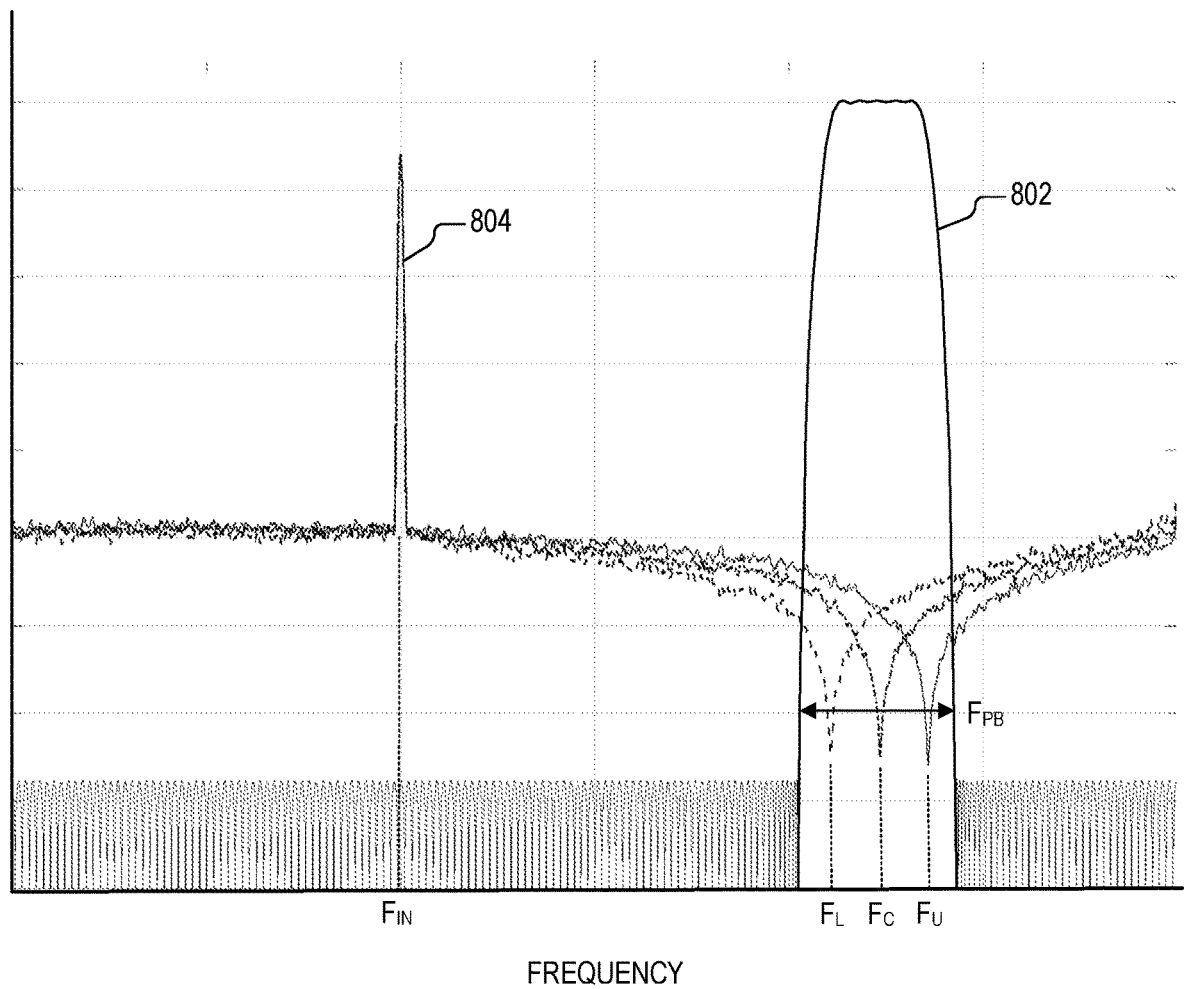
FIG. 8 is a graphic diagram plotting signal power of DOUT at the output of the sigma-delta ADC of FIG. 1 versus frequency for three separate resonant frequencies of the loop filter superimposed with a passband amplitude transfer function of the bandpass filters of FIG. 4 according to one embodiment of the present disclosure.

FIG. 8 is a graphic diagram plotting signal power of DOUT at the output of the sigma-delta ADC 102 versus frequency for three separate resonant frequencies of the loop filter 140 superimposed with a passband amplitude transfer function 802 of the bandpass filters 402 and 404 according to one embodiment of the present disclosure. It is noted that the spectra is averaged and the stop-band attenuation of the passband is increased for purposes of illustration. A low resonant frequency corresponds with a low notch frequency $F_L$, an optimum resonant frequency corresponds with a center notch frequency $F_C$, and a high resonant frequency Fu corresponds with an upper notch frequency Fu. For simulation operation, the loop controller 408 (or 708 or the like) is disabled or otherwise removed while the frequency adjust input 138 of the sigma-delta ADC 102 is manipulated by test equipment or the like to adjust the resonant frequency of the loop filter 140. The input signal AIN is asserted as a sinusoidal signal with an input frequency $F_{IN}$ as depicted by a spike 804 at $F_{IN}$. The passband amplitude transfer function 802 is centered at the center frequency $F_C$ with a passband frequency range $F_{PB}$ that includes $F_L$ and $F_U$.

FIG. 8 illustrates that adjustment of the resonant frequency of the loop filter 140 adjusts the notch frequency at the output of the sigma-delta ADC 102. The notch frequency may be outside passband frequency range $F_{PB}$ or anywhere within $F_{PB}$ of the bandpass filters 402 and 404, in which adjustment is performed during calibration to move the notch frequency at or as close as possible to the center frequency $F_C$.

Figure 9:
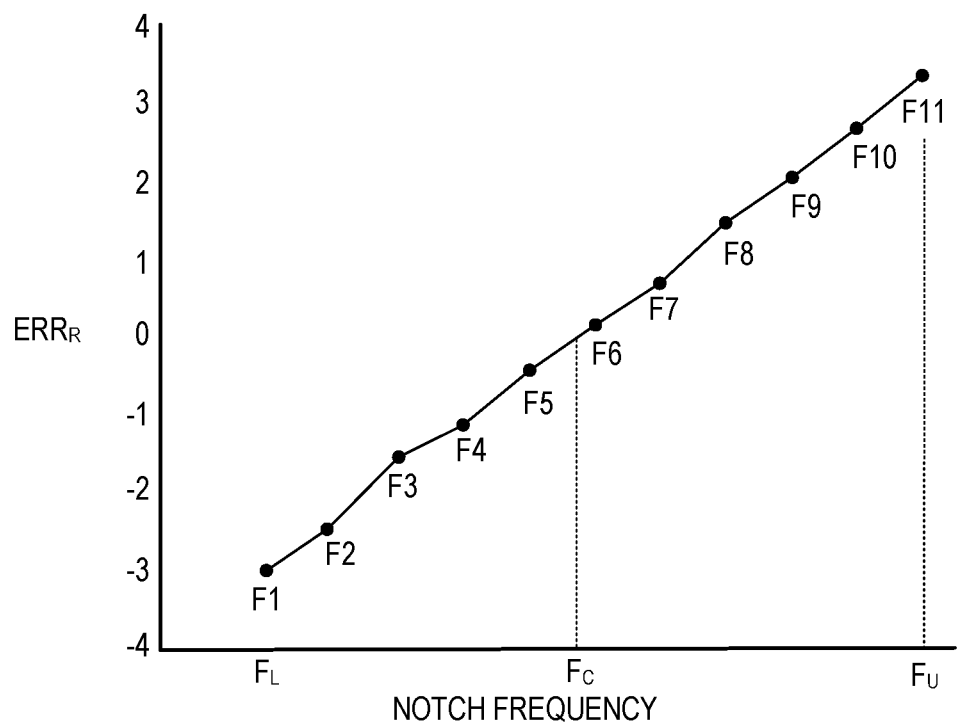
FIG. 9 is a graphic diagram plotting a normalized version of a real portion of the ERR signal versus frequency for a simulation of 11 notch frequency between $F_L$ and $F_U$ of the loop filter of FIG. 1 according to one embodiment of the present disclosure.

FIG. 9 is a graphic diagram plotting a normalized version of a normalized real portion of the ERR signal, shown as $ERR_R$, versus frequency for a simulation of 11 notch frequency points F1, F2, ..., F11 between $F_L$ and $F_U$ according to one embodiment of the present disclosure. The actual units and range of ERR and $ERR_R$ depend upon various factors, such as the NTF of the sigma-delta ADC 102 and the dither gain controlled by the gain p of the DAC 136 among other factors. The resonant frequency of the loop filter 104 is adjusted so that the notch frequency is incremented by $F_{PS}/10$ from $F_L$ to $F_U$. For each of the 11 frequency points, the real portion $ERR_R$ of the ERR signal between the bandpass filtered PRBS signal (or other injected signal) and the bandpass filtered output of the sigma-delta ADC 102 is calculated. As shown, $ERR_R$ varies linearly with respect to the notch frequency from about −3 for $F_L$ and the lower frequency end to about +3.5 for $F_U$ at the upper frequency end of the frequency passband $F_{PB}$ of the bandpass filters. The value of $ERR_R$ is zero or near zero at the center frequency $F_C$ of the passband which is the target notch frequency. The loop controller 408 thus controls or otherwise adjusts COR during calibration by increasing the resonant frequency of the loop filter 140 when $ERR_R$ is negative and decreasing the resonant frequency of the loop filter 140 when $ERR_R$ is positive until $ERR_R$ is at or near zero or otherwise minimized.

Figure 10:
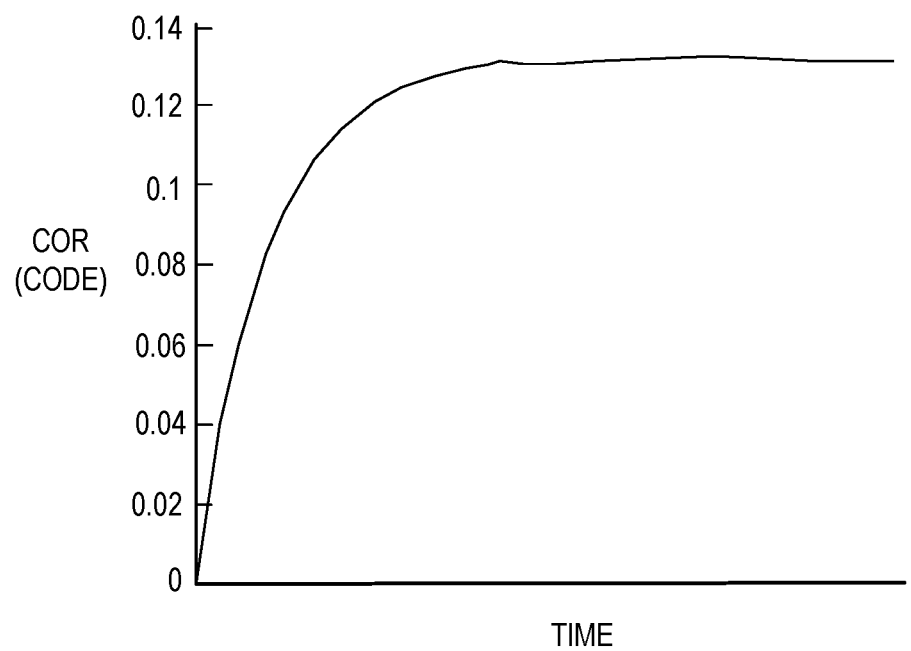
FIG. 10 is a graphic diagram plotting the COR signal as a correction code versus time for a closed-loop simulation of the analog to digital conversion system of FIG. 1 according to one embodiment of the present disclosure.

FIG. 10 is a graphic diagram plotting the COR signal as a normalized correction code versus time for a closed-loop simulation of the digital conversion system 100 according to one embodiment of the present disclosure. Although not specifically shown, the notch frequency is initially set at a low value, such as at or near $F_L$. As shown, COR increases and ultimately settles on a suitable value when the notch frequency reaches $F_C$. The correction code may be used to modify passive devices such as resistance(s) of at least one adjustable resistor, capacitance(s) of at least one adjustable capacitor, inductance(s) of at least one adjustable inductor of the loop filter 140 to adjust its resonant frequency and thus the output notch frequency. It is also contemplated that active devices such as transistors or the like may be adjusted, such as digitally selecting from among multiple devices coupled in parallel.

The convergence time is dependent on the gain of the control loop which can be adjusted by adjusting the gain of the amplifier 602 in the loop controller 408 or the gain of the LMS block 704 of the loop controller 708. The gain should be chosen such that the loop is fast enough, but after settling it should be sufficiently stable. The gain value depends on a lot of parameters like sampling rate, injected signal or dither amplitude and potential blocker signals. The control loop works such that after convergence the notch frequency is positioned in the middle of the bandpass filter transfer when the spectrum around the notch is symmetrical. The bandpass filter may be a digital filter, which can be centered around any frequency depending on its filter coefficients. The bandpass filter may also be constructed by a frequency shift (e.g., using a cordic or the like) in combination with a low-pass (decimation) filter, such as shown in FIG. 13 described further herein. The advantage of this approach is that the center frequency of the filter can be adapted with the cordic mixing frequency, and the signal processing frequency goes down when decimation is used.

Figure 11:
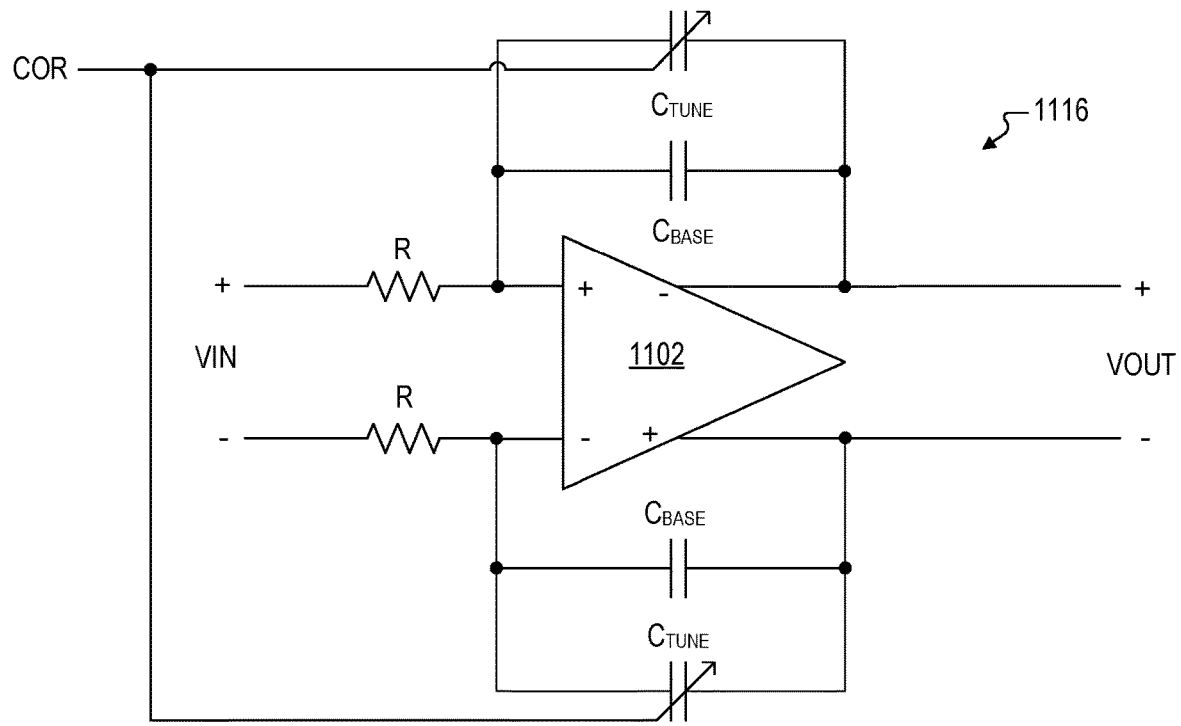
FIG. 11 is a schematic diagram of the integrator implemented according to one embodiment of the present disclosure that may be used as either or both of the integrators within the loop filter of FIG. 1.

FIG. 11 is a schematic diagram of the integrator 1116 implemented according to one embodiment of the present disclosure that may be used as the integrator 116 within the loop filter 140. The respective polarities of a differential input signal VIN are provided through a pair of input resistors each having a resistance R to respective inputs of a differential amplifier 1102. The differential amplifier 1102 has a differential output providing respective polarities of a differential output signal VOUT. Feedback circuitry including capacitors $C_{BASE}$ and $C_{TUNE}$ is coupled between both of the input polarities and output polarities of the amplifier 1102. The capacitor $C_{BASE}$ has a fixed capacitance coupled in parallel with the capacitor $C_{TUNE}$ having a variable capacitance that is adjusted by COR. COR may be used to adjust $C_{TUNE}$ for adjusting the overall gain of the integrator 116.

VOUT may be determined according to the following equation (3):

$$VOUT = \frac{1}{j\omega_1 R(C_{BASE} + C_{TUNE})} VIN \qquad (3)$$

where VOUT/VIN=$\omega_1$/s (in which "s" denotes the complex frequency domain in which s=j$\omega$). The gain $\omega_1$ may be determined according to the following equation (4):

$$\omega_1 = \frac{-1}{R(C_{BASE} + C_{TUNE})} \qquad (4)$$

In this manner, COR adjusts $C_{TUNE}$ which adjusts the gain $\omega_1$ of the integrator 1116, which in turn adjusts the resonant frequency of the loop filter 140. In addition or in the alternative, the integrator 118 may be configured in substantially the same manner as the integrator 1116 having a capacitor with adjustable capacitance $C_{TUNE}$ adjustable by COR for adjusting the gain $\omega_2$ of the integrator 118.

Figure 12:
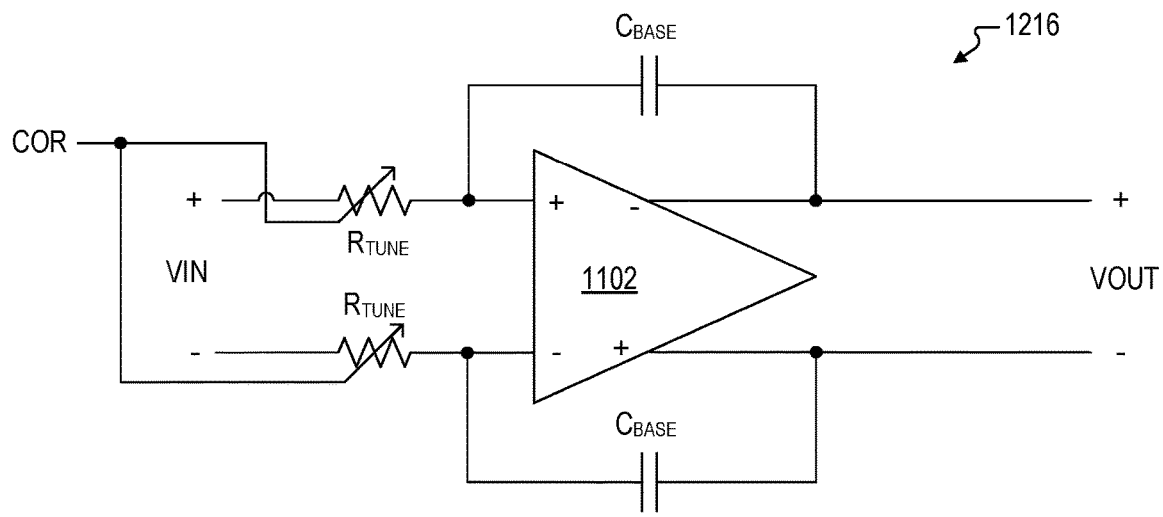
FIG. 12 is a schematic diagram of the integrator implemented according to another embodiment of the present disclosure that may be used as either or both of the integrators within the loop filter of FIG. 1.

FIG. 12 is a schematic diagram of the integrator 1216 implemented according to another embodiment of the present disclosure that may be used as either one or both of the integrators 116 and 118 within the loop filter 140. The integrator 1216 is substantially similar to the integrator 1116 except that the $C_{TUNE}$ capacitors are eliminated and the input resistors with resistance R are replaced by input resistors each with adjustable resistance $R_{TUNE}$. The gain $\omega_1$ or $\omega_2$ (depending upon which integrator 116 or 118 is implemented) is adjusted similar to that described in equation (4) with $C_{TUNE}$ removed (or set to 0) and R replaced by $R_{TUNE}$.

The illustrated integrators 1116 and 1216 are exemplary only and may be implemented according to a variety of different configurations, and the corresponding gain may be adjusted in a variety of different ways. It is also understood that COR may be used to adjust one or more elements of one or more of the amplifiers 120, 122, or 124 for adjusting amplifier gain and thus the resonant frequency of the loop filter 140. Although not specifically shown, for example, a loop filter may be implemented using one or more inductors in which corresponding inductance(s) may be adjusted. A system and method of calibration of a sigma-delta converter as described herein is not intended to be limited to the manner in which gain of at least one loop filter of the ADC is adjusted. The PRBS sequence is a signal that is typically used for sigma delta modulators and suits the need for the present calibration system and method. It is understood, however, that other types of injection signals having equivalent signal power levels left and right of the optimal frequency $F_C$ in the band $F_{PS}$ may also be used as the injected signal.

FIG. 13 is a simplified block diagram of a bandpass filter 1302 that may be used instead of each of the bandpass filters 402 and 404 according to one embodiment of the present disclosure. The bandpass filter 1302 includes a frequency to phase calculator 1304, a phase rotator (or cordic) 1306, and a lowpass decimation filter 1308. A target frequency signal FT is provided to an input of the frequency to phase calculator 1304, having an output providing a phase rotation signal. An input signal, such as either the DOUT signal or the injected signal (e.g., PRBS), is provided to one input of the phase rotator 1306, having a second input receiving the phase rotation signal, and having an output providing a frequency shifted signal to an input of the lowpass decimation filter 1308. The lowpass decimation filter 1308 has an output providing an OUT signal, which is either the A or B signal provided to a respective input of the correlator 406. In one embodiment, the target frequency signal FT is the center frequency $F_C$ which is the target notch frequency.

Figure 14:
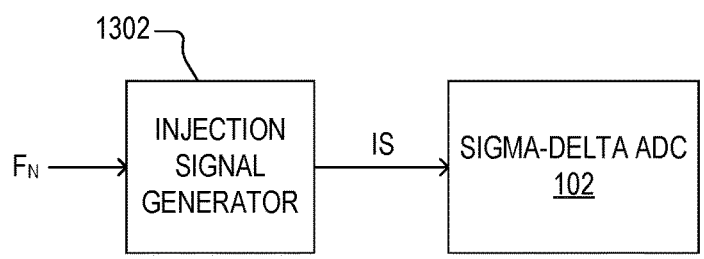
FIG. 14 is a simplified block diagram of an injection signal generator generating an injection signal IS that is injected into the sigma delta ADC of FIG. 1 according to another embodiment of the present disclosure.

FIG. 14 is a simplified block diagram of an injection signal generator 1402 generating an injection signal IS that is injected into the sigma delta ADC 102 according to another embodiment of the present disclosure. The injection signal generator 1402 may be provided for configurations in which the PRBS generator 104 is not provided or the PRBS signal is not available. The injection signal generator 1402 receives the target notch frequency FN and generates IS for insertion into the conversion path of the sigma-delta ADC 102, such as via the adders 112, 114, 126 or 128 or the like. The injection signal IS is substantially symmetrical around the target notch frequency FN within a selected frequency passband (e.g., $F_{PS}$) centered at the target notch frequency. In one embodiment, the injection signal IS may be a pseudo-random signal. In another embodiment, the injection signal IS may be a dual tone signal positioned on either side of the target notch frequency $F_N$.

It is noted that conversion system may be implemented with other types of sigma delta converters with multiple frequency notches. In that case, the correct center frequency for each notch frequency may be set using corresponding bandpass filters so that each notch frequency can be optimized. This can be done in a parallel or in a serial manner, depending on settling time and hardware complexity constraints. The present calibration settles more quickly without the presence of strong signals in the bandpass region of the filter pass band. If there is uncorrelated signal content in the band (for example from the input signal), the correlator may need to average longer to remove the uncorrelated content from the correlated content.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A digital conversion system, comprising:
a sigma-delta converter having an input, having a digital output, having a conversion path with an injection input, and having a frequency adjust input;
a signal generator having an output coupled to the injection input of the sigma-delta converter, wherein the signal generator is configured to provide an injection signal that is substantially symmetrical around a target notch frequency;
a first bandpass filter having an input coupled to the output of the signal generator for receiving the injection signal and having an output, and a second bandpass filter having an input coupled to the digital output of the sigma-delta converter and having an output, wherein the first and second bandpass filters are configured to perform filtering based on the target notch frequency of the digital output of the sigma-delta converter;
a correlator having a first input coupled to the output of the first bandpass filter, having a second input coupled to the output of the second bandpass filter, and having an output configured to provide an error signal; and
a loop controller having an input coupled to the output of the correlator for receiving the error signal and having an output coupled to the frequency adjust input of the sigma-delta converter.

2. The digital conversion system of claim 1, wherein the first and second bandpass filters each have a passband frequency range centered at the target notch frequency.

3. The digital conversion system of claim 1, wherein the first and second bandpass filters each comprise:
a frequency to phase calculator having an input for receiving the target notch frequency and having an output for providing a phase rotation signal;
a phase rotator having a first input for receiving either one of the injection signal and the digital output of the sigma-delta converter and having an output for providing a frequency shifted signal; and
a lowpass decimation filter having an input receiving the frequency shifted signal and having an output.

4. The digital conversion system of claim 1, wherein the sigma-delta converter comprises a loop filter configured to have a resonant frequency that is adjusted by a correction signal.

5. The digital conversion system of claim 1, wherein the sigma-delta converter comprises a loop filter having at least one adjustable capacitor having a capacitance that is adjusted by a correction signal.

6. The digital conversion system of claim 1, wherein the sigma-delta converter comprises a loop filter having at least one adjustable resistor having a resistance that is adjusted by a correction signal.

7. The digital conversion system of claim 1, wherein the first and second bandpass filters are substantially identical in which each is configured to only pass a part of the positive frequency band.

8. The digital conversion system of claim 1, wherein the signal generator comprises a pseudo random bit stream generator configured to provide a PRBS signal as a pseudo random signal, and wherein the PRBS signal is provided as a dither signal to an injection input of the sigma-delta converter.

9. The digital conversion system of claim 1, wherein the correlator comprises:
a complex conjugate block having an input coupled to the output of either one of the first and second bandpass filters and having an output;
a multiplier configured to multiply the output of the complex conjugate block with the output of another one of the first and second bandpass filters to provide a product; and
a mean calculator configured to calculate the mean of the product and that provides the mean of the product as the error signal.

10. The digital conversion system of claim 1, wherein the sigma-delta converter comprises an analog to digital sigma-delta converter configured for receiving an analog signal and for providing a single bit output.

11. The digital conversion system of claim 1, wherein the loop controller comprises:
a gain block having an input coupled to the output of the correlator for receiving the error signal and having an output providing an amplified error signal;
an integrator having an input coupled to the gain block for receiving the amplified error signal and having an output providing an integrated signal; and
a converter that converts the integrated signal into a correction signal provided to the frequency adjust input of the sigma-delta converter.

12. The digital conversion system of claim 1, wherein the loop controller comprises:
a least-mean square block having an input coupled to the output of the correlator for receiving the error signal and having an output for providing a least-mean square signal; and
a converter configured to convert the least-mean square signal into a correction signal provided to the frequency adjust input of the sigma-delta converter.

13. A method of digital conversion, comprising:
converting an input signal with a sigma-delta converter to provide a digital output signal;
injecting an injection signal into a conversion path of the sigma-delta converter, wherein the injection signal has substantially frequency-symmetrical power around a target notch frequency;
bandpass filtering the injection signal to provide a filtered random signal;
bandpass filtering the digital output signal of the sigma-delta converter to provide a filtered output signal;
correlating the filtered random signal with the filtered output signal to provide an error signal; and
adjusting a resonant frequency of the sigma-delta converter based on the error signal so that the digital output signal has a target notch frequency.

14. The method of claim 13, wherein the bandpass filtering the injection signal and the bandpass filtering the digital output signal each comprise bandpass filtering with a center frequency at the target notch frequency of the digital output signal of the sigma-delta converter.

15. The method of claim 13, wherein the correlating comprises:
taking a complex conjugate of either one of the injection signal and the digital output signal to provide a conjugate signal;
multiplying the conjugate signal with the another one of the injection signal and the digital output signal to provide a product signal; and
determining a mean value of the product signal.

16. The method of claim 13, further comprising:
amplifying the error signal to provide an amplified error signal;

integrating the amplified error signal to provide an integrated signal;

converting the integrated signal to provide a correction signal; and using the correction signal to adjust the resonant frequency of the sigma-delta converter.

17. The method of claim 13, further comprising:

determining a least-mean square of the error signal to provide a least-mean square signal;

converting the least-mean square signal to provide a correction signal; and using the correction signal to adjust the resonant frequency of the sigma-delta converter.

18. The method of claim 13, wherein the adjusting comprises adjusting a resonant frequency of a loop filter of the sigma-delta converter.

19. The method of claim 13, wherein the adjusting comprises adjusting either one of a capacitance of a capacitor and a resistance of a resistor of a loop filter of the sigma-delta converter.

20. The method of claim 13, wherein the injecting an injection signal comprises generating and injecting a pseudo random bit stream signal used as a dither signal for the sigma-delta converter.

* * * * *